(12) United States Patent
Bauer et al.

(10) Patent No.: US 8,039,755 B2
(45) Date of Patent: Oct. 18, 2011

(54) METHOD FOR MANUFACTURING A PRINTED CIRCUIT BOARD ELEMENT AS WELL AS A PRINTED CIRCUIT BOARD ELEMENT

(75) Inventors: Wolfgang Bauer, Graz (AT); Johannes Stahr, Bruck an der Mur (AT)

(73) Assignee: AT & S Austria Technologie & Systemtechnik Aktiengesellschaft, Leoben-Hinterberg (AT)

( * ) Notice: Subject to any disclaimer, the term of this patent is extended or adjusted under 35 U.S.C. 154(b) by 135 days.

(21) Appl. No.: 12/465,901

(22) Filed: May 14, 2009

(65) Prior Publication Data

US 2009/0229867 A1  Sep. 17, 2009

Related U.S. Application Data

(62) Division of application No. 10/585,476, filed as application No. PCT/AT2005/000010 on Jan. 21, 2005, now Pat. No. 7,552,525.

(30) Foreign Application Priority Data

Jan. 23, 2004 (AT) .................................. A 85/2004

(51) Int. Cl.
  *H05K 1/03* (2006.01)
(52) U.S. Cl. ......................................... 174/255; 174/261
(58) Field of Classification Search .................. 174/255, 174/261; 361/772–779
  See application file for complete search history.

(56) References Cited

U.S. PATENT DOCUMENTS

| 4,870,746 A | 10/1989 | Klaser |
| 5,827,604 A * | 10/1998 | Uno et al. ..................... 428/209 |
| 6,242,079 B1 | 6/2001 | Mikado et al. |
| 6,376,052 B1 | 4/2002 | Asai et al. |
| 6,500,350 B1 | 12/2002 | Hunt et al. |
| 6,645,297 B1 | 11/2003 | Suzuki et al. |
| 2001/0023535 A1 * | 9/2001 | Dunn .............................. 29/847 |
| 2003/0132025 A1 | 7/2003 | Wakihara et al. |
| 2003/0150101 A1 | 8/2003 | Park et al. |
| 2003/0157264 A1 | 8/2003 | Hutchinson et al. |
| 2004/0239474 A1 | 12/2004 | Dunn et al. |

FOREIGN PATENT DOCUMENTS

| EP | 1 102 523 | 5/2001 |
| EP | 1 327 995 | 7/2003 |
| JP | 63262476 | 10/1988 |
| JP | 64-42896 A | 2/1989 |
| JP | 02174188 | 7/1990 |
| JP | 04078471 | 3/1992 |
| JP | 06260741 | 9/1994 |
| JP | 11121926 | 4/1999 |
| JP | 2000-082871 A | 3/2000 |
| JP | 2000-315854 A | 11/2000 |
| JP | 2001-015927 A | 1/2001 |

OTHER PUBLICATIONS

Patent Abstracts of Japan of JP 11121926 dated Apr. 30, 1999.
Patent Abstracts of Japan of JP 63262476 dated Oct. 28, 1988.
Patent Abstracts of Japan of JP 02174188 dated Jul. 5, 1990.
Patent Abstracts of Japan of JP 04078471 dated Mar. 12, 1992.
Patent Abstracts of Japan of JP 06260741 dated Sep. 16, 1994.
Office Action from the Japanese Patent Office in connection with the counterpart Japanese Application No. with partial English translation.

* cited by examiner

*Primary Examiner* — Jeremy Norris
(74) *Attorney, Agent, or Firm* — Ladas & Parry LLP

(57) ABSTRACT

A circuit board element and production thereof are disclosed, whereby a noble metal is applied to a structured conductor layer on a circuit board substrate, comprising said conductor layer. The conductor layer is roughened on the surface, preferably after the structuring thereof and the noble metal applied as a layer, essentially on all of the structured roughened conductor layer, whereupon the noble metal layer surface is given a corresponding roughness.

11 Claims, 2 Drawing Sheets

Figure 1:
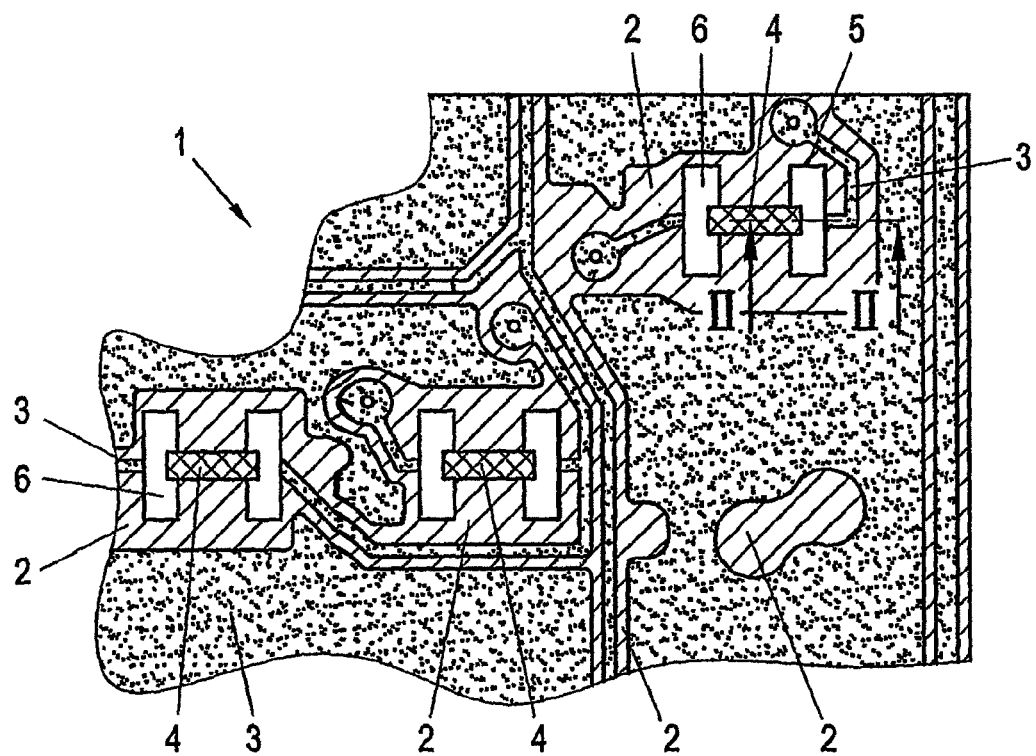

METHOD FOR MANUFACTURING A PRINTED CIRCUIT BOARD ELEMENT AS WELL AS A PRINTED CIRCUIT BOARD ELEMENT

This application is a divisional of application number 10/585,476 filed on Jul. 17, 2006 now U.S. Pat. No. 7,552,525, which is a 371 International Application No.: PCT2005/000010 filed on Jan. 21, 2005, which designated the U.S., claims the benefit thereof and incorporates the same by reference.

The invention relates to a method for manufacturing a printed circuit board element, wherein starting from a printed circuit board substrate with at least one conductor layer, preferably two conductor layers, these or at least one conductor layer, respectively, is structured and noble metal is applied thereon.

The invention further relates to a printed circuit board element with at least one, preferably two structured conductor layer(s) applied on a substrate, and with a noble metal on the or at least one conductor layer, respectively.

The term "printed circuit board element" is to be understood as one-sided or double-sided printed circuit board or also as a multilayer printed circuit board, mounted or not yet mounted with components, wherein it is primarily essential that a substrate, usually from an epoxy resin layer, is present with at least one metallic, electrically conductive layer, normally made of copper, provided thereon. Hereinafter, the metallic layer is designated as "conductor layer". Said conductor layer may be an outer layer or also, in the case of a multilayer, an inner layer.

It has already been proposed to locally provide on sites where electric components are to be mounted a noble metal layer, especially made of silver, on the copper conductor layer. This particularly happens when PTF components (PTF—polymer thick film) is mounted by means of a printing process, wherein here especially PTF resistors are used. The noble metal layer between the copper of the conductor layer and the PTF paste of the components enhances the stability of the circuit, which circuit may be negatively affected by, e.g., moisture; the noble metal layer forms a "blocking layer" insofar as it helps to avoid corrosion of copper on account of moisture, e.g. when the PTF paste hardens. On the other hand, it improves the electric contact between the copper of the conductor layer and the PTF paste.

This, however, involves the drawback that the noble metal layer can only be applied on locally very limited sites, namely exactly on sites to be imprinted with the PTF paste; providing the noble metal layer on the whole copper conductor layer, would, however, highly negatively affect the adherence of layers to be applied thereon. For example, in the case of a pressing to the multilayer, the necessary interlaminar adherence to a printed circuit board structure provided thereon would no longer be present, and the result would be a delamination when mounting on such a printed circuit board element, and thus a total defect of the printed circuit board element. If the conductor layer is an outer layer, i.e. no epoxy-resin/conductor layer structure is to be mounted, it is, as a rule, necessary for mounting components to create a solder stop mask on the outer layer, and in the case of a noble metal layer such a solder stop mask would adhere only badly. For these reasons, as mentioned above, the noble metal can only be applied on locally very limited sites, and the remaining copper conductor layer surface, when further proceeding the printed circuit board element, is covered with a separate adherence promoting layer to promote either the mounting of a solder stop mask or pressing to the multilayer.

For the only partial application of the noble metal on locally limited areas of the conductor layer, however, separate process steps are required, i.e. applying of a masking layer and removing thereof; nevertheless, spalling of the materials present thereon occurs over and over again in the region of the noble metal surface, and thus results in defects.

It is now the aim of the invention to provide a method for manufacturing a printed circuit board element and a printed circuit board element, respectively, of the initially defined kind, wherein efforts and costs for the process steps of masking and demasking during manufacture can be avoided, so that the manufacture is essentially simplified, and wherein, nevertheless, an excellent adherence of the individual layers to each other is rendered possible, no separate (additional) adherence promoting layer on the conductor layer being necessary.

To achieve this aim, the invention provides a method and a printed circuit board element, respectively, as defined in the independent claims.

Advantageous embodiments and further developments are indicated in the dependent claims.

With the inventive technique, the noble metal layer itself forms an adherence promoting layer on which subsequent layers, such as a further printed circuit board structure or also a solder stop mask, can be applied with good adherence thereto. Moreover, the material of PTF components produced by imprinting, especially PTF resistors, but also solder material, or, in the case of an adhesive fastening, adhesive material of prefabricated components excellently adheres to the noble metal layer. This good adherence of the different materials is achieved by using a roughened surface of the noble metal layer instead of a smooth one. Said surface roughness is created already in the conductor layer, usually made of copper, present under the noble metal layer, wherein the surface roughness is provided in an order of magnitude of at least that of the thickness of the noble metal layer, preferably being larger by one order of magnitude. Thus, said surface roughness of the conductor layer is also maintained when subsequently applying the noble metal layer. Particularly, the surface roughness of the conductor layer is in the range of between 0.05 µm and 5 µm, especially 0.3 and 3 µm, preferably 0.5 µm and 1 µm, and the preferred thickness of the noble metal layer is between 0.02 µm and 1 µm, preferably between 0.02 µm and 0.5 µm. The surface of the conductor layer may be roughened, e.g. by chemical etching, mechanical processing or by electroplating. The noble metal layer is then applied on said roughened conductor layer, e.g. electroless or by electroplating, by cathodic evaporation or sputtering. It is advantageous to use silver, gold, palladium, nickel or a combination of the individual ones of these metals or all of the metals, as noble metal. After having applied said comparably thin noble metal layer on the whole surface of the conductor layer (instead of applying only locally on small partial sections), wherein the surface roughness is maintained, electrical components, such as, in particular, PTF resistors, etc, can be applied by imprinting, and a pressing to a multilayer may follow or also a solder stop mask may be mounted in order to allow for the attachment of prefabricated electric components in an automatic soldering process.

An exemplary production according to the inventive technique provides for the following basic steps:
 a) structuring the copper conductor layer (usually by etching in a photolithographic process)
 b) roughening the surface of the conductor layer
 c) applying the noble metal layer
 d) applying the components (e.g., PTF resistors)
 e) pressing to a multilayer.

Compared thereto, in the conventional standard process the following principal steps are necessary:
a) structuring the conductor layer
b') applying a separate adherence promoting agent on the conductor layer (usually by means of an oxidation process and by the aid of organic constituents)
c') applying and structuring a photoresist layer
c'') partial applying a noble metal layer
c''') removing the photoresist layer
d) applying the components
e) pressing to the multilayer As can be directly learned from this comparison, cost-intensive steps are rendered unnecessary by the inventive technique, if proceeding according to the invention; furthermore, the properties of the printed circuit board elements are improved.

Figure 2:
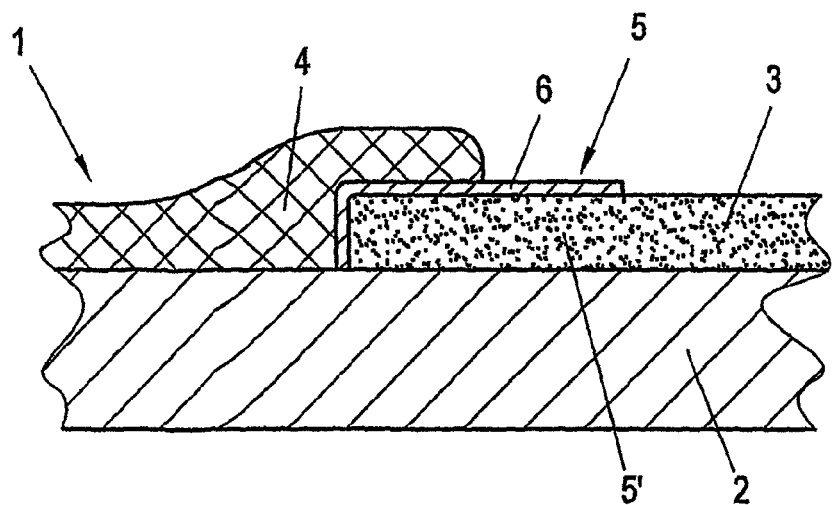
Figure 3:
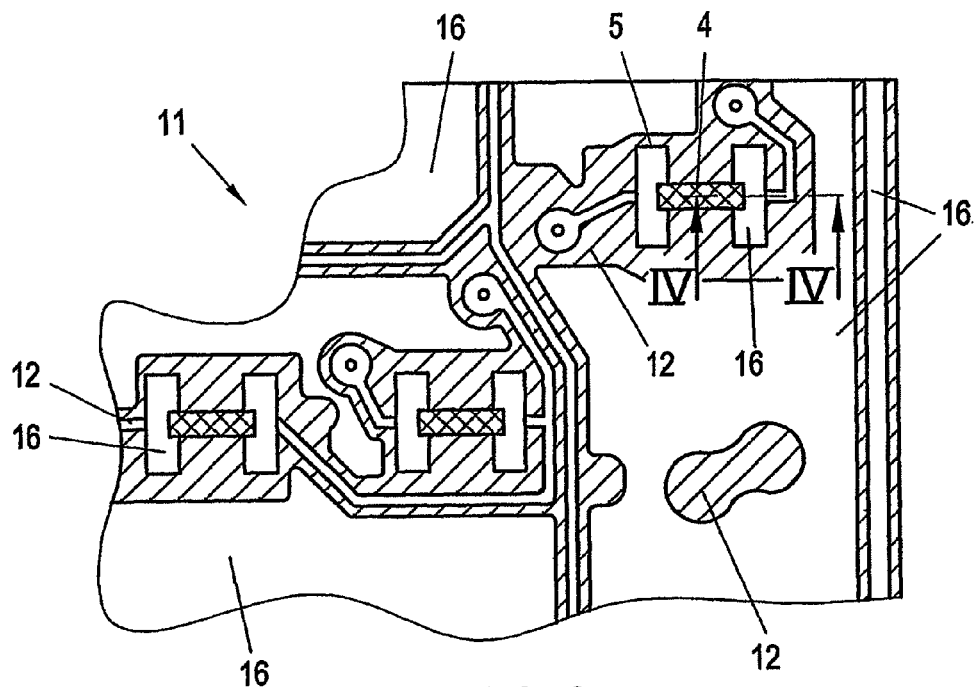
Figure 4:
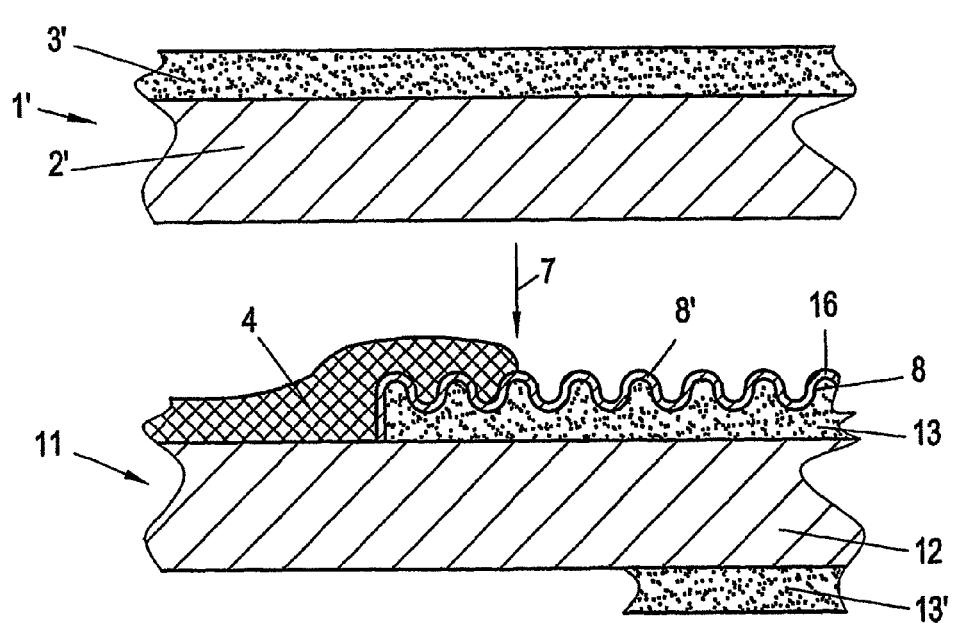

Hereinafter, the invention is further explained by way of preferred exemplary embodiments, yet without being restricted thereto, and by the drawings. In detail, the drawings show in:

FIG. 1 a schematic top view on a printed circuit board element with local noble metal layers on a copper layer according to the prior art;

FIG. 2 a schematic section through a part of said printed circuit board element on a larger scale according to line II-II of FIG. 1;

FIG. 3 a schematic top view on a printed circuit board element according to the invention in correspondence with the illustration of FIG. 1; and FIG. 4 a cross section through said printed circuit board element similar to the illustration of FIG. 2, wherein additionally a printed circuit board structure, which is to be pressed on, having a copper outer layer as well as a bottom conductor layer is illustrated.

In FIG. 1 a part of the printed circuit board element 1 is schematically shown in top view, the layered structure of the printed circuit board 1 furthermore being apparent from FIG. 2 by way of example.

In FIG. 1 individual materials of the printed circuit board element 1, as they are visible on the upper side of the printed circuit board element 1, are illustrated by hatched lines, dotted lines or double-hatched lines for a better differentiation, wherein the single-hatched lines illustrate epoxy resin substrate 2 (cf. also FIG. 2), on which a structured metal layer 3, especially made of copper, is present, which layer is illustrated by dotted lines for a better differentiation. Hereinafter, said metal layer 3 is referred to as conductor layer 3 for the sake of simplicity, and by its structuring (by means of photolithographic techniques) these areas on the upper side have become visible, i.e. have been uncovered, in which the epoxy resin substrate 2 lying thereunder, hereinafter generally referred to as printed circuit board substrate 2 or shortly substrate 2, can be seen from the upper side.

Furthermore, double-hatched lines refer to electric components 4 which are components, in particular resistors, e.g. imprinted by means of PTF technique (PTF Polymer Thick Film). In the region of the ends of said components 4, in particular resistors, connecting or contact surfaces, respectively, are provided, which are formed by the corresponding areas 5' (cf. FIG. 2) of conductor layer 3 as well as of further noble metal layers 6 locally applied thereon. In FIG. 1 said noble metal layers 6 are illustrated as free surfaces without any hatches or the like, in the cross section illustrated in FIG. 2, however, with hatches.

Noble metal layers 6 consists, in conventional manner, of, e.g. a thin local silver layer, and they form a blocking or stabilizing layer; when components 4 are mounted and fixed (hardened) said layer hinders moisture from reaching conductor layer 3 and thus prevents corrosion of said conductor layer 3 in the contact area. Furthermore, said noble metal layer 6 also improves the electric contact between component 4 and conductor layer 3.

This known technique involves the drawback that the noble metal layer 6 can be applied only locally, in very limited areas, namely in the areas of contact surfaces 5. If such noble metal coating was applied on the whole conductor layer 3, a subsequent coating of the printed circuit board element 1, as illustrated in FIGS. 1 and 2, e.g. with a further printed circuit board structure or also with a solder stop mask, would not adhere at all or only very poorly, and this would result in a relatively quick detachment of the applied layer(s).

On the other hand, applying the noble metal layers 6 only locally requires relatively great effort during manufacture, as separated steps are necessary for masking the upper side of the printed circuit board element 1 as well as for removing said masking after having applied noble metal layers 6. Moreover, practice shown that, when further layers are applied on layers 6, local spalling of said applied layers occurs in the area of noble metal layers 6, e.g., when printed circuit board element 1, as illustrated in FIGS. 1 and 2, is pressed to a multilayer (cf. also FIG. 4), and, in particular, spalling of the materials of components 4 (PTF resistors) off the noble metal layers 6 has been observed.

The inventive technique allows for a complete coating of conductor layer 13 on substrate 12 with noble metal, as can be seen in FIG. 3, and as a result, conductor layer 13 is fully or substantially fully covered with a noble metal layer 16. The above-mentioned masking and demasking processes, as required in the known technique, are thereby rendered unnecessary. Nevertheless, excellent adherence of the layers applied thereon is rendered possible, e.g. the adherence of a substrate 3' of a printed circuit board structure 1', which structure has an outer conductor layer 3', when pressed to a multilayer, cf. FIG. 4 in which said pressing (simultaneously with a heating) is schematically illustrated by arrow 7. Instead of such a printed circuit board structure 1', as shown in FIG. 4, e.g. also a solder stop mask can be mounted onto the upper side of the printed circuit board element 11 according to FIGS. 3 and 4. Also in this case good adherence is obtained.

To obtain this good adherence, conductor layer 14 is roughened on its surface before applying noble metal layer 16, wherein surface roughness 8 shown in FIG. 4 is illustrated quite schematically by a wavy line. The comparatively thin noble metal layer 16 also follows said surface roughness 8 of conductor layer 13, so that its upper side also shows a corresponding roughness 8'. This surface roughness 8' then guarantees the mentioned good adherence of a layer applied thereon, e.g. of an epoxy resin substrate layer 2' or a solder stop mask.

Printed circuit board substrates of the conventional type, such as, e.g. FR 4 substrate, can be the basis for the present printed circuit board element 11, wherein, as mentioned above, an epoxy resin substrate 2 and a copper layer 13 applied thereon are present. If possible, substrate 2 can also be provided with a conductor layer (copper layer) 13' on the bottom side, as illustrated in FIG. 4, and said conductor layer 13' can also be correspondingly roughened and provided with a noble metal layer. The mounted component 4 preferably is a polymer thick-film component, in particular a PTF resistor, which is attached in a printing process. Such a PTF resistor consists, e.g., of phenolic resin, in which, depending on the resistance value, carbon particles are included in the required concentration.

Noble metal layer 16 may consist of silver, as already mentioned, but also of gold, palladium, platinum or nickel or similar noble metals. Depending on the materials used, also corresponding roughening and application techniques, respectively, are employed. These techniques are known per se and therefore they are only briefly mentioned hereinafter.

In the case of a noble metal layer 16 made of silver, the basis for the coating preferably constitutes a simple exchange reaction, wherein the copper of conductor layer 3 is replaced by silver of noble metal layer 16 according to the relation $$Ag_{aq}^+ + \tfrac{1}{2}Cu_s \rightarrow Ag_s + \tfrac{1}{2}Cu_{aq}^{2+} \tag{1}$$

Said exchange reaction happens between copper and silver on account of the potential difference, and a very compact silver layer on the copper layer is obtained. The result are silver layers 16, of a thickness in the range of between 0.1 μm and 0.25 μm (generally preferably between 0.02 μm and 0.5 μm).

In the case of a palladium coating, hydrogen and an activator containing palladium is applied, whereby an autocatalytic reaction is initiated:

$$Pd^\circ + H_2 \rightarrow Pd^\circ + 2H_{ads} \tag{2}$$

$$Pd^{++} + 2H_{ads} \rightarrow Pd^\circ + 2H \tag{3}$$

$$2Red. \rightarrow \frac{[Pd^\circ]}{pH < 3,5} H_2 + CO_2 \tag{4}$$

$$2Red. + Pd^{++} \rightarrow Pd^{\circ+} + 2H + CO_2 \tag{5}$$

At a pH of <3.5 decomposition of the reduction agent starts, and reactions occur in the diffusion layer only. The released hydrogen guarantees the continuance of the reaction.

Comparable chemical coating techniques can be used for nickel and gold.

Other per se conventional techniques can, however, also be used for applying the noble metal layer 16 on the conductor layer 3, such as, e.g., attaching of the noble metal on the conductor layer 13 by electroplating, attaching of the noble metal by cathodic evaporation or application by sputtering. The noble metal layer, as mentioned above, advantageously has a thickness of between 0.02 μm and 1 μm.

After of before being conventionally photolithographically structured, the surface of conductor layer 13 can be roughened by means of various per se conventional techniques. For example, roughening by a mechanical process is conceivable, as well as by electroplating or by ionic or chemical etching, respectively, wherein an etching medium, e.g. on the basis of hydrogen peroxide/sulfuric acid, is used. The surface roughness is provided in an order of magnitude of between 0.05 μm and 5 μm, preferably 0.3 μm and 3 μm, in particular 0.5 μm and 1 μm, and partly needle-like surface structures are obtained. (As mentioned above, the wave-like illustration of FIG. 4 is to be viewed only very schematically, it is, however, also provided to make clear that surface roughness 8 and 8', respectively, is greater, i.e. is provided in a larger dimensions compared to the thickness of noble metal layer 16.)

The invention claimed is:

1. A printed circuit board element comprising a substrate and at least one structured conductor layer on the substrate, which conductor layer has a roughened surface, and further comprising a surface-rough noble metal layer which is directly applied on the whole roughened conductor layer at lease one imprinted electric PTF component being mounted on the surface-rough noble metal layer, said noble metal layer serving as a contact promoting and stabilizing layer, on the one hand, and as an adherence promoting layer, on the other hand.

2. The printed circuit board element according to claim 1, wherein a further printed circuit board structure is provided on the surface-rough noble layer, forming a multilayer configuration.

3. The printed circuit board element according to claim 1, wherein a solder stop mask is mounted on to the surface-rough noble metal layer.

4. The printed circuit board element according to claim 1, wherein the imprinted electric PTF component is a resistor.

5. The printed circuit board element according to claim 1, wherein the conductor layer (13) and the noble metal layer, respectively, has a surface roughness of between 0.05 μm and 5 μm.

6. The printed circuit board element according to claim 5, wherein the surface roughness is between 0.3 μm and 3 μm.

7. The printed circuit board element according to claim 6, wherein the surface roughness is between 0.5 μm and 1 μm.

8. The printed circuit board element according to claim 1, wherein the noble metal layer has a thickness of between 0.02 μm and 1.

9. The printed circuit board element according to claim 8, wherein the noble metal layer has a thickness of between 0.02 μm and 0.5 μm.

10. The printed circuit board element according to claim 1, wherein the noble metal layer comprises at least one metal selected from the group consisting of silver, gold, palladium, and platinum.

11. The printed circuit board element according to claim 1, wherein the substrate has two structured conductor layers and wherein on at least one layer a noble metal layer is applied.

* * * * *